United States Patent
Huang et al.

(10) Patent No.: US 10,680,620 B2
(45) Date of Patent: Jun. 9, 2020

(54) FREQUENCY GENERATOR AND METHOD FOR GENERATING FREQUENCY

(71) Applicant: SHENZHEN GOODIX TECHNOLOGY CO., LTD., Guangdong (CN)

(72) Inventors: Yen-Yin Huang, Guangdong (CN); Jung-Yu Chang, Guangdong (CN); Ming-Feng Hsu, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/507,654

(22) Filed: Jul. 10, 2019

(65) Prior Publication Data

US 2019/0334529 A1 Oct. 31, 2019

Related U.S. Application Data

(63) Continuation of application No. PCT/CN2018/080993, filed on Mar. 29, 2018.

(51) Int. Cl.
*H03L 7/08* (2006.01)
*H03L 7/099* (2006.01)
(Continued)

(52) U.S. Cl.
CPC ............ *H03L 7/0802* (2013.01); *H03L 7/099* (2013.01); *H03L 7/181* (2013.01); *H03L 7/193* (2013.01)

(58) Field of Classification Search
CPC ..... H03L 7/0802; H03L 7/081; H03L 7/0812; H03L 7/0805; H03L 7/197; H03L 7/1974; H03L 7/1976; H03L 7/1978
See application file for complete search history.

(56) References Cited

U.S. PATENT DOCUMENTS

| 7,012,985 B1* | 3/2006 | Nix | H03K 23/42 327/117 |
| 7,495,517 B1* | 2/2009 | Hoang | H03L 7/093 331/16 |

(Continued)

FOREIGN PATENT DOCUMENTS

| CN | 101217277 A | 7/2008 |
| CN | 102055466 A | 5/2011 |

(Continued)

OTHER PUBLICATIONS

English Abstract Translation of Foreign Reference CN102055466A.

(Continued)

*Primary Examiner* — An T Luu
(74) *Attorney, Agent, or Firm* — WPAT, P.C., Intellectual Property Attorneys; Anthony King

(57) ABSTRACT

A frequency generator, includes a control unit, configured to receive an input signal to generate a divisor signal, a phase signal and a circulation signal; a frequency divider, configured to receive the input signal and perform an integer division to the input signal according to the divisor signal, so as to generate a frequency division signal; a circulating delay circuit, coupled to the frequency divider and configured to perform at least one circulating operation to the frequency division signal, and for each circulating operation, generate at least one phase delay signal; a first multiplexer, coupled to the circulating delay circuit and configured to select one signal from the frequency division signal and the at least one phase delay signal according to the phase signal, so as to generate a multiplexed signal; and a retimer, coupled to the first multiplexer and configured to generate an output signal.

20 Claims, 7 Drawing Sheets

(51) Int. Cl.
*H03L 7/181* (2006.01)
*H03L 7/193* (2006.01)

(56) References Cited

U.S. PATENT DOCUMENTS

| | | | |
|---|---|---|---|
| 9,685,966 B2* | 6/2017 | Chen | ............ H03K 21/023 |
| 2010/0253397 A1 | 10/2010 | Badillo | |
| 2012/0098603 A1 | 4/2012 | Cho et al. | |
| 2014/0139272 A1 | 5/2014 | Tertinek | |

FOREIGN PATENT DOCUMENTS

| CN | 102832932 A | 12/2012 |
|---|---|---|
| WO | WO 2015135490 A1 | 9/2015 |

OTHER PUBLICATIONS

English Abstract Translation of Foreign Reference CN102832932A.
English Abstract Translation of Foreign Reference CN101217277A.
Cheng et al., a 2.2 GHz Programmable DLL-Based Frequency Multiplier for SOC Applications, 2004 IEEE Asia-Pacific Conference on Advanced System Integrated Circuits (AP-ASIC2004)/ Aug. 4-5. 2004 (p. 74-75).
Yang et al., A 35-GHz Frequency Synthesizer Using Frequency Doubling and Phase Rotating Technology, 2013 13th International Symposium on Communications and Information Technologies (p. 266-270).
Antonov et al., Open-loop all-digital delay line with on-chip calibration via self-equalizing delays.

* cited by examiner

FREQUENCY GENERATOR AND METHOD FOR GENERATING FREQUENCY

CROSS REFERENCE TO RELATED APPLICATIONS

The present application is a continuation of international application No. PCT/CN2018/080993, filed on Mar. 29, 2018, of which is incorporated herein by reference in its entirety.

TECHNICAL FIELD

The present disclosure relates to a frequency generator, and more particular to a low-power open-loop fractional frequency generator.

BACKGROUND

Electronic system needs frequency signals with different frequencies so that it can be adapted to different operations or applications; considering the design and manufacturing cost, electronic systems often generate frequency signals with different frequencies according to the reference frequency signals.

Generally, when there is a fractional-multiple relationship between the frequency of the input signal and the frequency of the output signal, a multiphase frequency generator and a frequency combiner are used to generate the desired output signal. Reference is made to FIG. 1, which is a schematic diagram illustrating a multiphase frequency generator 10. The multiphase frequency generator 10 includes a phase generator 100, a multiplexer 102, an edge combiner 104 and a phase selector 106. The phase generator 100 is configured to receive an input signal CKIN to generate a plurality of phase signals; the multiplexer 102 selects a desired phase according to the indication of the phase selector 106 and delivers the desired phase to the edge combiner 104; the edge combiner 104 generates an output signal CKOUT according to the selected phase, and delivers the output signal CKOUT to the phase selector 106. It should be noted that when performing the fractional frequency division operation, more phase generating units are required in the phase generator 100 in order to improve the resolution of the plurality of phase signals, thereby resulting in additional power consumption; moreover, the mismatch among phase generating units also results in the increased noise of the output signal.

Further, reference is made to FIG. 2, which is a schematic diagram illustrating a frequency combiner 20. The frequency combiner 20 includes a frequency and phase detector 200, a charging pump 202, a low-pass filter 204, a voltage controlled oscillator 206, a programmable frequency divider 208 and a sigma-delta modulator 210. The frequency combiner 20 uses the sigma-delta modulator 210 to receive a frequency divided output frequency signal CKOUT to adjust the divisor of the programmable frequency divider 208. In this way, the average of the output frequency signals CKOUT generated by the frequency combiner 20 and reference frequency signal CKIN are in a fractional-division relationship. However, since the sigma-delta modulator 210 of the frequency combiner 20 would generate the quantization noise, one should reduce the loop bandwidth or enhance the resolution of the programmable frequency divider 208 to inhibit the quantization noise, wherein reducing the loop bandwidth can be achieved by increasing the circuit area, whereas enhancing the resolution can be achieved by increasing the number of the output phase of the voltage controlled oscillator 206, thereby resulting in the generation of additional power consumptions.

Accordingly, there is a need to improve the status of art.

BRIEF SUMMARY OF THE DISCLOSURE

Accordingly, the purpose of certain embodiments of the present disclosure is to provide a low-power open-loop fractional frequency generator to address the deficiencies of the conventional art.

To address the above-mentioned issues, the present disclosure provides a frequency generator that includes a control unit, configured to receive an input signal to generate a divisor signal, a phase signal and a circulation signal; a frequency divider, configured to receive the input signal, and perform integer division to the input signal according to the divisor signal, so as to generate a frequency division signal; a circulating delay circuit, coupled to the frequency divider and configured to perform at least one circulating operation to the frequency division signal, and for each circulating operation, generates at least one phase delay signal; a first multiplexer, coupled to the circulating delay circuit and configured to select one signal from the frequency division signal and the at least one phase delay signal according to the phase signal, so as to generate a multiplexed signal; and a retimer, coupled to the first multiplexer and configured to generate an output signal according to the circulation signal, the multiplexed signal and the frequency division signal.

For example, the frequency divider divides the frequency of the input signal by an integer or by the integer plus one, so as to perform an integer division to the input signal, thereby generating the frequency division signal.

For example, the circulating delay circuit includes a NOT-AND (NAND) gate that is configured to receive the frequency division signal and circulation phase signal, so as to generate a first phase delay signal; and at least one delay unit, which is connected in series with each other to form a series, wherein the first delay unit of the series receives the first phase delay signal, and each delay unit delays the phase delay signal outputted from the previous delay unit to generate the at least one phase delay signal, and the last delay unit of the series outputs the circulation phase signal.

For example, for each circulating operation, the frequency division signal is inputted to the sequence of the at least one delay unit, and the circulation phase signal is outputted from the last delay unit of the series to the NAND gate.

For example, the retimer includes at least one D type flip-flop, which connected in series with each other and configured to receive the multiplexed signal, wherein the frequency input terminal of the at least one D type flip-flop receives the multiplexed signal, so as to generate at least one retiming signal at the signal output terminal of the at least one D type flip-flop; and a second multiplexer, which is coupled to the at least one D type flip-flop and configured to select one signal from the at least one retiming signal according to the circulation signal, so as to generate the output signal.

The present disclosure further provides a method for generating frequency, wherein the method is used in a frequency generator that includes a frequency divider, configured to receive an input signal so as to generate a frequency division signal; a circulating delay circuit, coupled to the frequency divider and configured to generate at least one phase delay signal according to the frequency division signal; a multiplexer, coupled to circulating delay circuit and configured to perform a signal selection; a retimer, coupled to the multiplexer and configured to generate an output signal, wherein the method for generating frequency includes steps of: using the frequency divider to perform integer division to the input signal according to the divisor signal generated by the control unit, so as to generate the frequency division signal; using the circulating delay circuit to perform at least one circulating operation according to the frequency division signal, and for each circulating operation, to generate the at least one phase delay signal; using the multiplexer select one signal from the frequency division signal and the at least one phase delay signal according to the phase signal generated by the control unit, so as to generate a multiplexed signal; and using the retimer to generate the output signal according to the circulation signal generated by the control unit, the frequency division signal and the multiplexed signal.

DETAILED DESCRIPTION

Purposes, technical solutions and advantages of the present disclosure are best understood from the following detailed description when read with the accompanying figures. It is noted that, embodiments provided herein are for discussing the present disclosure, and shall not be construed as limiting to the present disclosure. Further, it will be understood that when an element is referred to as being "connected to" or "coupled to" another element, it may be directly connected to or coupled to the other element, or intervening elements may be present.

Figure 1:
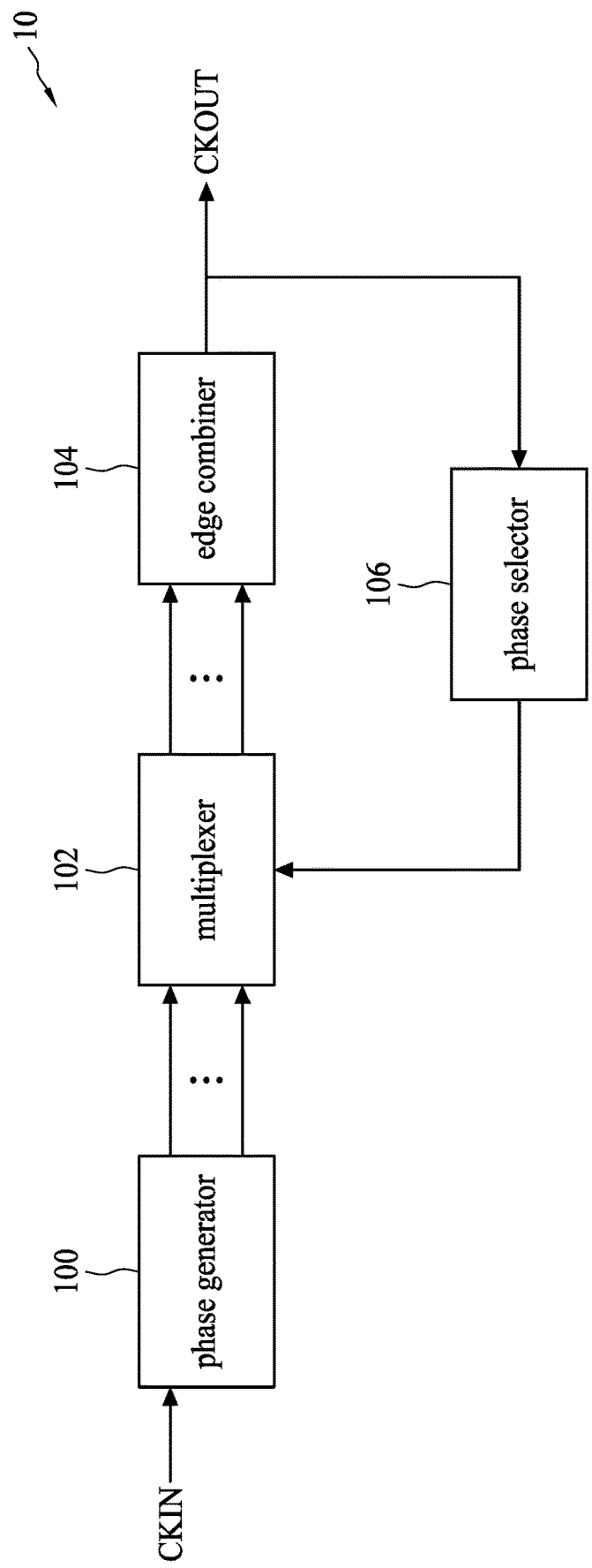
FIG. 1 is a schematic diagram illustrating a multiphase frequency generator.
Figure 2:
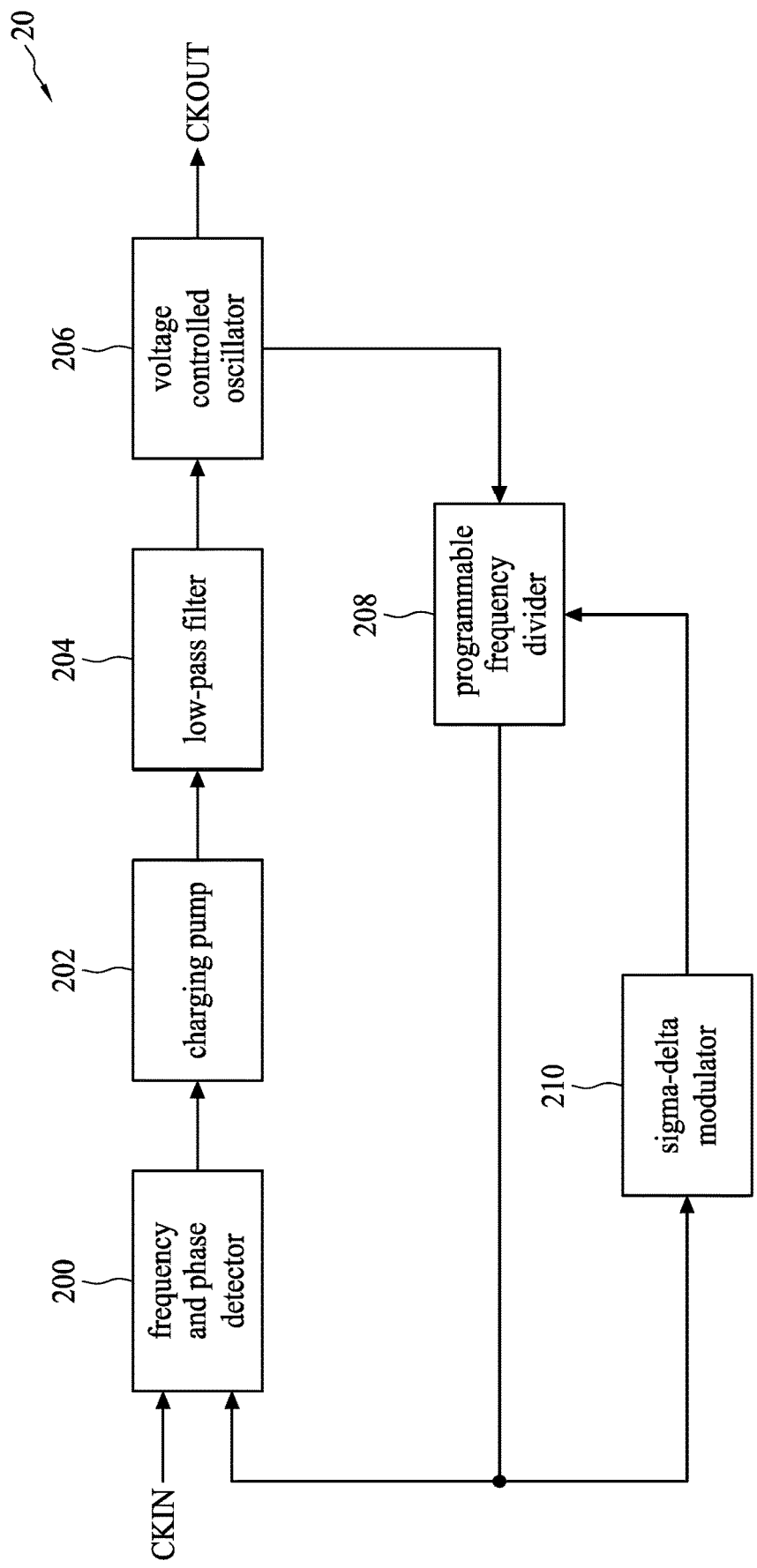
FIG. 2 is a schematic diagram illustrating a frequency combiner.
Figure 3:
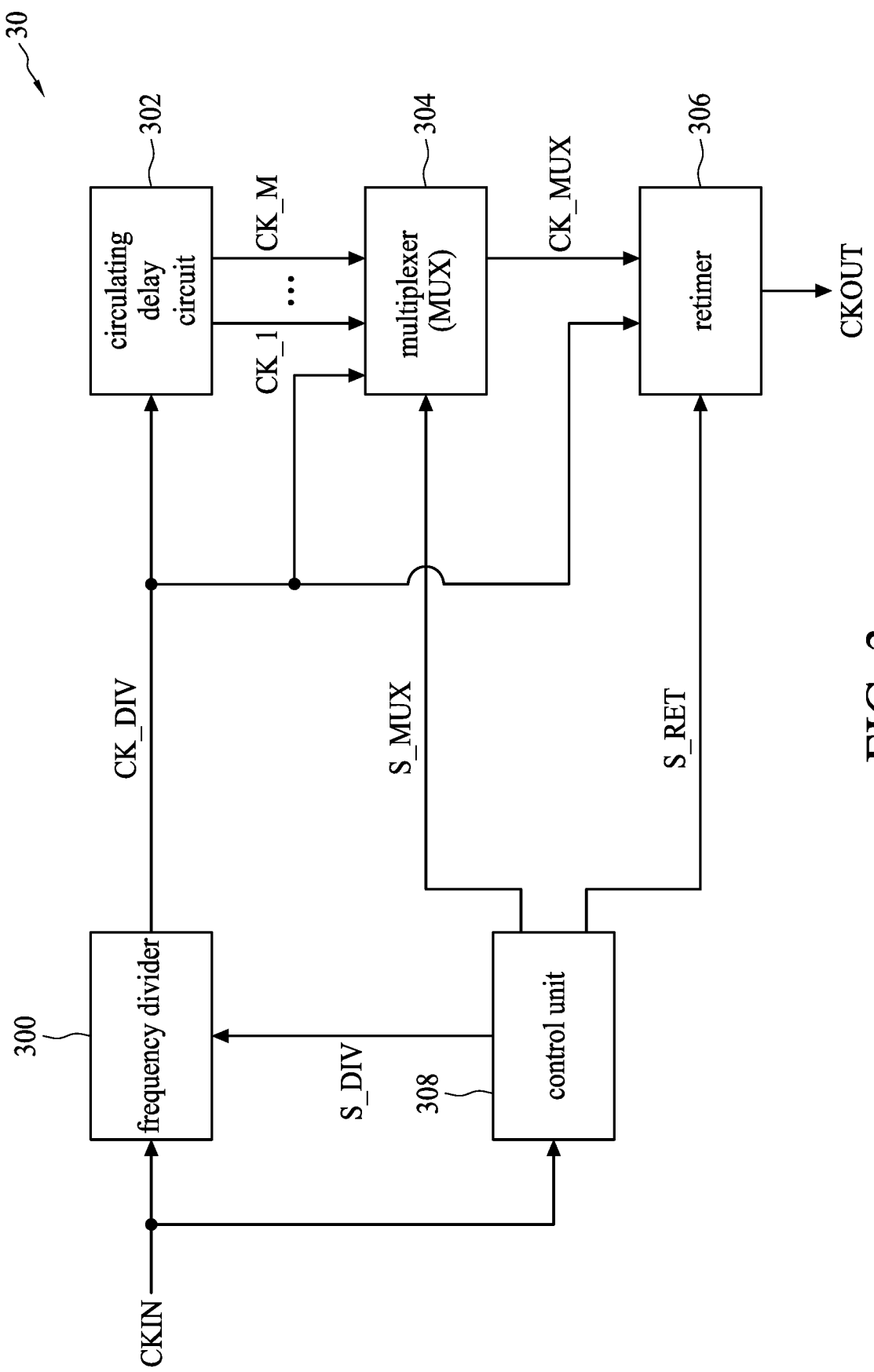
FIG. 3 is a schematic diagram illustrating a frequency generator according to one embodiment of the present disclosure.

Reference is made to FIG. 3, which is a schematic diagram illustrating a frequency generator 30 according to one embodiment of the present disclosure. The frequency generator 30 includes a frequency divider 300, a circulating delay circuit 302, a multiplexer (MUX) 304, a retimer 306 and a control unit 308. The control unit 308 is configured to receive an input signal CKIN, so as to generate a divisor signal S_DIV, a phase signal S_MUX and a circulation signal S_RET, which are used to control the elements of the frequency generator 30. The frequency divider 300 receives the input signal CKIN and is configured to perform an integer division to the input signal CKIN according to divisor signal S_DIV, so as to generate a frequency division signal CK_DIV. The circulating delay circuit 302 is coupled to the frequency divider 300 and configured to perform a circulating operation according to the frequency division signal CK_DIV, so as to generate at least one phase delay signals CK_1~C_M, wherein, the circulating delay circuit 302 may be calibrated in advance to adjust the delay of the phase delay signals CK_1~CK_M, and may be used to repetitively perform the circulating operation, so that during each circulating operation, it may generate different phase delay signals CK_1~CK_M. The multiplexer 304 is coupled to the circulating delay circuit 302 and configured to select one signal from frequency division signal CK_DIV and the phase delay signals CK_1~CK_M according to the phase signal S_MUX, so as to generate a multiplexed signal CK_MUX. The retimer 306 is coupled to the frequency divider 300 and the multiplexer 304, and configured to generate an output signal CKOUT according to the frequency division signal CK_DIV and the circulation signal S_RET; in other words, by selecting the circulation signal S_RET, the retimer 306 may output the multiplexed signal CK_MUX as the output signal CKOUT at a correct circulating operation.

Specifically, the frequency generator 30 performs a fractional division to the input signal CKIN to generate the output signal CKOUT. To achieve the operation of the fractional division, first, the frequency generator 30 uses a frequency divider 300 capable of changing the divisor to receive the input signal CKIN, so as to perform the integer division to the input signal CKIN, thereby generating the frequency division signal CK_DIV. It should be noted that since the frequency and period are reciprocal to each other, performing the division to the input signal CKIN using the frequency divider 300 means that the period of the input signal CKIN are increased by the integer multiple. Next, the circulating delay circuit 302 receives the frequency division signal CK_DIV, and generate at least one phase delay signals CK_1~CK_M according to the frequency division signal CK_DIV, wherein, the circulating delay circuit 302 continuously performs the circulating operation and, for each circulating operation, generates the phase delay signals CK_1~CK_M. It should be noted that the circulating delay circuit 302 may be adjusted using a calibration in advance, so that the phase or delay of the phase delay signal matches the requirement of the system; further, the phase differences between each phase delay signal CK_1~CK_M are the same, and the frequency generator 30 may select an appropriate circulating operation and phase delay signal according to the system requirements, thereby obtaining an appropriate phase for performing the fractional frequency division operation. The multiplexer 304 receives the frequency division signal CK_DIV and M phase delay signals CK_1~CK_M, and select one signal from the frequency division signal CK_DIV and M phase delay signals CK_1~CK_M according to the phase signal S_MUX, wherein the selected signal is used as the multiplexed signal CK_MUX. The retimer 306 receives the multiplexed signal CK_MUX and is configured to output the multiplexed signal CK_MUX as the output signal CKOUT according to the circulation signal S_RET and the frequency division signal CK_DIV; in other words, the circulating delay circuit 302 continuously performs the circulating operation, and accordingly, for each circulating operation, the phase of the multiplexed signal CK_MUX selected by the multiplexer 304 would change, and the retimer 306 outputs the multiplexed signal CK_MUX as the output signal CKOUT during the correct circulating operation according to circulation signal S_RET, thereby accomplishing the fractional frequency division operation. Specifically, the present disclosure uses the frequency divider 300 to perform the integer frequency division operation, so as to generate a frequency division signal CK_DIV having a period that is the integer multiple times of the input signal CKIN; uses the circulating delay circuit 302 to, at each circulating operation, generate at least one phase delay signals CK_1~CK_M; uses the multiplexer 304 to select one signal from the frequency division signal CK_DIV and M phase delay signals CK_1~CK_M as the multiplexed signal CK_MUX according to the phase signal; and uses the retimer 306 to obtain the phase of the phase delay signal during the correct circulating operation according to the circulation signal S_RET, so as to output the multiplexed signal CK_MUX as the output signal CKOUT. In this way, by using the circulating delay circuit 302 to perform the circulating operation, the present disclosure may use the limited circuit to generate phases continuously, and operate only when the CK_DIV is high, thereby reducing the power consumption; further, by using the multiplexer 304 and the retimer 306 to select the appropriate signal and delay, it achieves an open-loop and low-power frequency generator.

For example, in one embodiment, the frequency generator 30 of the present disclosure may be configured to perform a fractional division frequency operation with a divisor of 17/5; in other words, the frequency generator 30 generates an output signal CKOUT with an output period Tout which is 17/5 times (i.e., 3+2/5 times) of the input period Tin of the input signal CKIN. In order to increase the input period Tin by 3+2/5 times, the present disclosure, by using the frequency divider 300 to perform the frequency division operation of the integer, to generate a frequency division signal CK_DIV having a period which is the integer multiple of the input period. Then, the circulating delay circuit 302 is used to continuously perform the circulating operation, and for each circulating operation, generate a phase delay signal, and the multiplexer 304 and the retimer 306 are used to select the correct signal and circulating operation time, to compensate the insufficient frequency adjustment made by the frequency divider 300, thereby generating an output signal CKOUT having a period that is 3+2/5 times of the period of the input signal CKIN.

Figure 4:
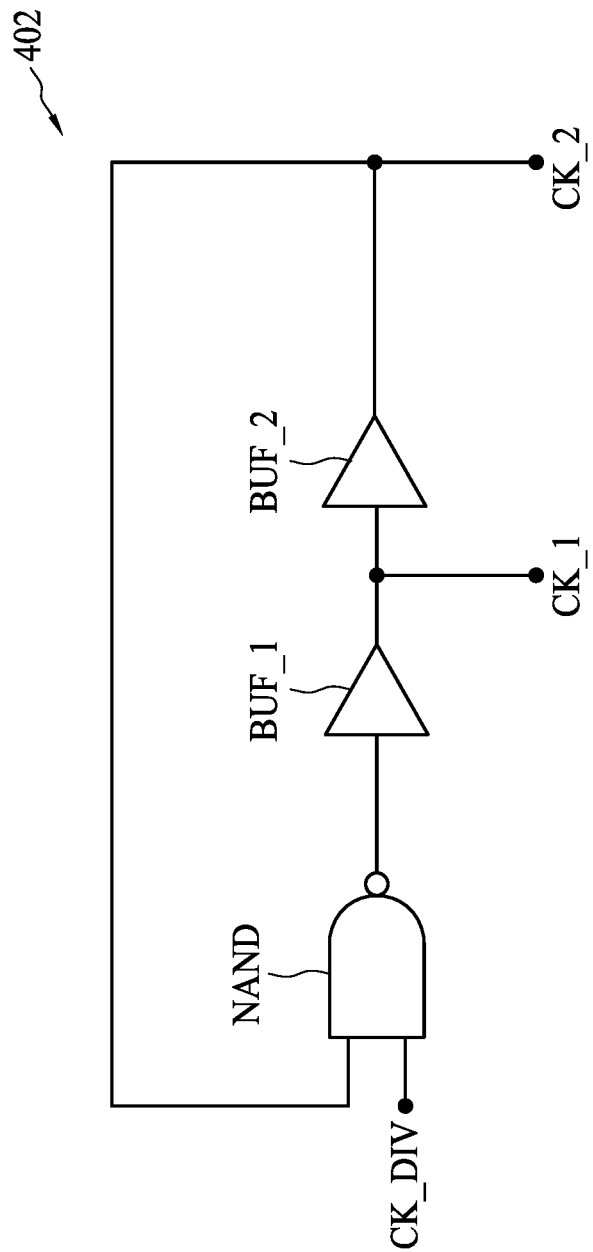
FIG. 4 is a schematic diagram illustrating a circulating delay circuit according to one embodiment of the present disclosure.

Specifically, the frequency divider 300 of the present disclosure can be designed as a frequency divider capable of performing an integer frequency division operation with a divisor of 3 or a divisor of 4, which may perform a frequency division operation to the input signal according to the divisor signal S_DIV. The circulating delay circuit 302 may be designed to generate two sets of phase delay signals CK_1, CK_2, and the delays of the phase delay signals CK_1, CK_2 are respectively 1/5 of the input period (i.e., Tin/5) and 2/5 of the input period (i.e., 2Tin/5); in this way, during the first circulating operation, the delays of the phase delay signals CK_1, CK_2 are respectively 1/5 of the input period Tin and 2/5 of the input period Tin; in the second circulating operation, the delays of the phase delay signals CK_1, CK_2 are respectively 3/5 of the input period Tin and 4/5 of the input period Tin; and so on; in this way, the circulating delay circuit 302 may generate different phase delay signals to make up for the frequency division operation with the insufficient frequency division signal CK_DIV. Further, with respect to the circulating delay circuit of the present disclosure, reference is made to FIG. 4, which is a schematic diagram illustrating a circulating delay circuit 402 according to one embodiment of the present disclosure. The present circulating delay circuit 402 includes a NOT-AND gate NAND, and buffers BUF_1, BUF_2 that are serially connected to form a series, and buffers BUF_1, BUF_2 may respectively generate phase delay signals CK_1, CK_2. First, the circulating delay circuit 502 may perform gating using the NOT-AND gate NAND, wherein when the frequency division signal CK_DIV is high and delivered to the NOT-AND gate NAND, the serially connected series of buffers BUF_1, BUF_1 is switched on and continuously perform the circulating operations, and continuously generate the phase delay signals CK_1, CK_2; when the frequency division signal CK_DIV is low and delivered to the NOT-AND gate NAND, the serially connected series of buffers BUF_1, BUF_1 is switched off and do not perform the circulating operation, and hence do not output phase delay signals CK_1, CK_2. Further, the last buffer BUF_2 of the series feeds the phase delay signal CK_2 back to the NOT-AND gate NAND. Use the NOT-AND gate NAND to deliver the phase delay signal CK_M to the series of buffers, so as to accomplish a complete circulating operation. In this way, by using the gating of the NOT-AND gate NAND and by repetitively using fewer circuits to continuously generate phase delay signals during the circulating operation, the present frequency generator 30 may use the circulating delay circuit 302 to achieve the low-power frequency generator.

Figure 5:
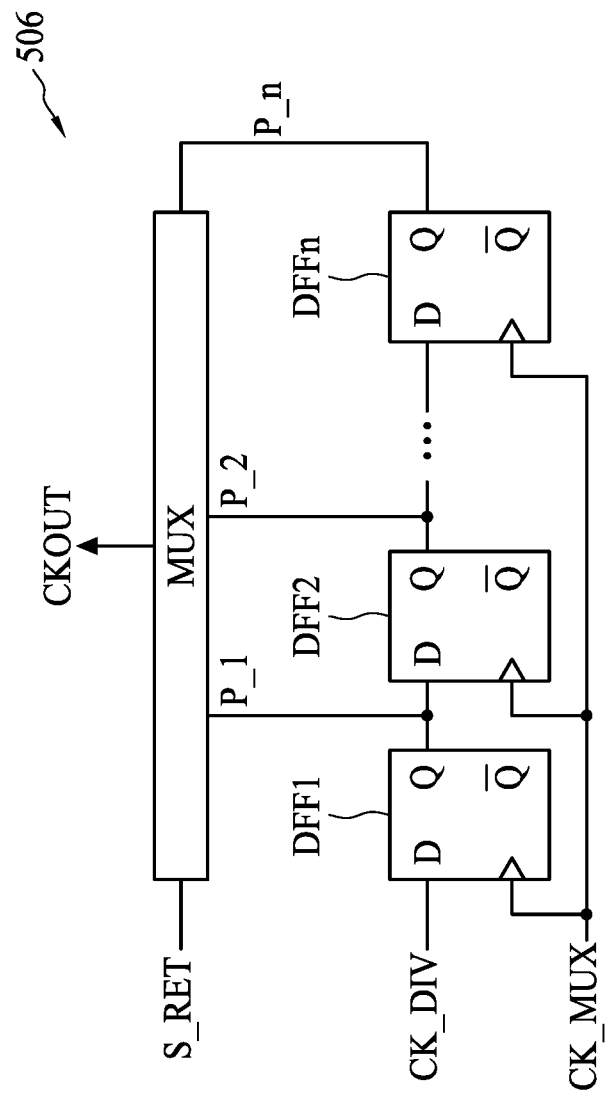
FIG. 5 is a schematic diagram illustrating a retimer according to one embodiment of the present disclosure.

Next, the retime of this embodiment is discussed further with reference to FIG. 5, which is a schematic diagram illustrating a retimer 506 according to one embodiment of the present disclosure. The retimer 506 includes N D-type flip-flops DFF1~DFFn and a multiplexer MUX. As illustrated, the data output terminal of one D-type flip-flop is coupled to the data input terminal of another D-type flip-flop; accordingly, N D-type flip-flops are serially connected to form a series; in this case, the series of the D-type flip-flops DFF1~DFFn is a shift register. The data input terminal of the D-type flip-flop DFF1 that is at the front end of the series is configured to receive the frequency division signal CK_DIV, and the frequency input terminals of all the D-type flip-flops DFF1~DFFn in the series receive the multiplexed signal CK_MUX, so that a first retiming signal P_1 to an $n^{th}$ retiming signal P_n are respectively generated at the data output terminals of the D-type flip-flops DFF1~DFFn, and the D-type flip-flops DFF1~DFFn in the series may deliver the frequency division signal CK_DIV according to the trigger of the multiplexed signal CK_MUX, and wherein during the first circulating operation when the multiplexed signal CK_MUX triggers the D-type flip-flops DFF1~DFFn for the first time, the D-type flip-flop DFF1 delivers the frequency division signal CK_DIV to the first retiming signal P_1; during the second circulating operation when the multiplexed signal CK_MUX triggers the D-type flip-flops DFF1~DFFn for the second time, the D-type flip-flop DFF2 delivers the first retiming signal P_1 to the second retiming signal P_2. In this way, the retimer 506 may, upon the trigger of the multiplexed signal CK_MUX during different circulating operations, generate the retiming, and further by using the multiplexer MUX to select one signal from the first retiming signal P_1 to the $n^{th}$ retiming signal P_n as the output signal CKOUT according to the circulation signal S_RET, acquire the appropriate signal phase, thereby achieving an open-loop frequency generator for fractional-frequency division operations.

Figure 6:
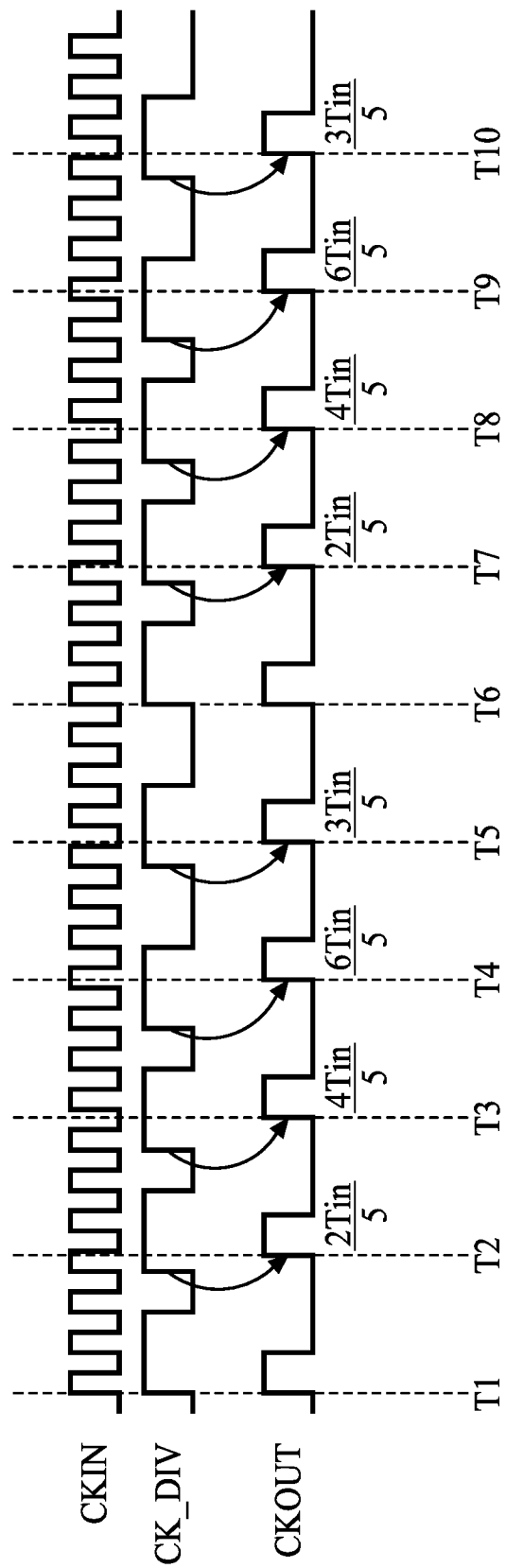
FIG. 6 is a schematic diagram illustrating the signals associated with the operation of the frequency generator shown in FIG. 3.

Further, reference is made to FIG. 6, which is a schematic diagram illustrating the signals associated with the operation of the frequency generator 30 shown in FIG. 3. In this embodiment, the frequency generator 30 may perform a fractional frequency division operation with a divisor of 17/5. Specifically, the frequency divider 300 may perform a frequency division operation with a divisor of 3 or 4; the circulating delay circuit 302 may generate two sets of phase delay signals CK_1, CK_2, and the delays of the phase delay signals CK_1, CK_2 are respectively 1/5 of the input period Tin and 2/5 of the input period Tin; the multiplexer 304 selects one signal from the phase delay signals CK_1, CK_2 according to the phase signal, so as to generate a multiplexed signal CK_MUX; the retimer 306 generates an output signal CKOUT according to the trigger of a multiplexed signal CK_MUX and the instruction of a circulation signal S_RET. As shown in the drawing, at a time point T1, the input signal CKIN and the output signal CKOUT align with each other. A divisor signal S_DIV generated by the control unit 308 instructs the frequency divider 300 to perform an integer frequency division operation to the input signal CKIN with a divisor of 3, so as to generate a frequency division signal CK_DIV; during each circulating operation, the circulating delay circuit 302 generates phase delay signals CK_1, CK_2 according to the frequency division signal CK_DIV; the phase signal S_MUX generated by the control unit 308 instructs the multiplexer 304 to select the phase delay signal CK_2 as the multiplexed signal CK_MUX; the circulation signal S_RET generated by the control unit 308 instructs the retimer 306 to select the multiplexed signal CK_MUX generated during the first circulating operation as the output signal CKOUT; in this way, by using the multiplexer 304 and the retimer 306 to select the phase delay signal CK_2 of the first circulating operation, the period of the frequency division signal CK_DIV may be increased by an additional ⅖ of the input period Tin, thereby achieving the fractional frequency division operation; similarly, at a time point T2, the frequency divider 300 uses the divisor of 3; the multiplexer 304 selects the phase delay signal CK_2 as the multiplexed signal CK_MUX; the retimer 306 selects the multiplexed signal CK_MUX generated during the second circulating operation as the output signal CKOUT according to the phase signal; accordingly, the period of the frequency division signal CK_DIV may be increased by an additional ⅘ of the input period Tin. At a time point T3, the frequency divider 300 uses the divisor of 3; the multiplexer 304 selects the phase delay signal CK_2 as the multiplexed signal CK_MUX; the retimer 306 selects the multiplexed signal CK_MUX generated during the third circulating operation as the output signal CKOUT according to the phase signal S_MUX; accordingly, the period of the frequency division signal CK_DIV may be increased by an additional 6/5 of the input period Tin. It should be noted that at a time point T4, the divisor signal S_DIV instructs the frequency divider 300 to use a divisor of 4; the phase signal S_MUX instructs the multiplexer 304 to select the phase delay signal CK_1 as the multiplexed signal CK_MUX; the retimer 306 select the multiplexed signal CK_MUX generated during the second circulating operation as the output signal CKOUT according to the phase signal; accordingly the period of the frequency division signal CK_DIV may be increased by an additional ⅗ of the input period Tin. At a time point T5, the frequency divider 300 uses the divisor of 4; the multiplexer 304 selects the frequency division signal CK_DIV as the multiplexed signal CK_MUX; the retimer 306 outputs the frequency division signal CK_DIV as the multiplexed signal CK_MUX. In this way, the frequency generator 30 may use the frequency divider 300 to perform the integer frequency division operation, use the circulating delay circuit 302 to continuously perform the circulating operation to generate phase delay signals CK_1, CK_2, use the multiplexer 304 and the retimer 306 to select the correct circulating operation and phase delay signal, and preferably adjust the period of the frequency division signal CK_DIV so as to generate the output signal CKOUT, thereby achieving an open-loop and low-power frequency generator. As for the time point T3, when the frequency divider 300 uses the divisor of 3, the period is increased by an addition which is 6/5 of the input period Tin by the circulating delay circuit 302, the multi-plexer 304 and the retimer 306. Alternatively, the frequency divider 300 may perform a frequency division operation with a divisor of 4, the addition of the input period Tin is adjusted correspondingly to ⅕ of the input period Tin by the circulating delay circuit 302, multiplexer 304 and the retimer 306, so as to generate an appropriate output signal CKOUT. As long as the divisors before and after the adjustment are the same (the divisor before the adjustment is (3+6/5), and the divisor after the adjustment is (4+⅕)). By using the control unit 308 to determine, in advance, the integer divisor and the amount of delay of the next frequency division signal CK_DIV whenever it receives a frequency division signal CK_DIV to generate a corresponding divisor signal S_DIV, phase signal S_MUX, and circulation signal S_RET to control the frequency divider 300, the circulating delay circuit 302, the multiplexer 304 and the retimer 306.

Specifically, when the frequency generator 30 performs the fractional frequency division operation with a divisor of Q/M, it can be viewed as a fractional frequency division operation in which the frequency is divided by a divisor of (N+P/M), wherein N, P and M are positive integers, and the relationship between P, Q, M and N is (Q=MN+P). On the other hand, the frequency division operation performed by the frequency generator 30 will result in the output period Tout being the (N+P/M) times of the input period Tin (i.e., the period and the frequency are reciprocal). Accordingly, the present disclosure may perform a frequency division operation to the input signal CKIN with a divisor of N or (N+1) by the frequency divider 300. The frequency division operation for the remaining divisor of P/M is implemented by the circulating delay circuit 302, the multiplexer 304 and the retimer 306. In the above-mentioned embodiment, the divisor 17/5 equals (3+⅖), accordingly, the frequency divider 300 may perform a frequency division operation with a divisor of 3 or a divisor of 4, whereas the frequency division operation for the remaining divisor of ⅖ are implemented by the circulating delay circuit 302, multiplexer 304 and the retimer 306. First, by adjusting the delay of the circulating delay circuit 302, during each circulating operation, the delays of the phase delay signals CK_1~CK_2 are respectively ⅕ of the input period Tin and ⅖ of the input period Tin, and each circulating operation delay is ⅖ of the input period Tin. It further selects an appropriate phase delay signal using the multiplexer 304 and selects a correct circulating operation using the retimer 306, and adjusts the duty cycle of the output signal CKOUT. In this way, the present frequency generator 30 may perform a frequency division operation of fractional-division to the input signal CKIN, so as to generate the output signal CKOUT.

Figure 7:
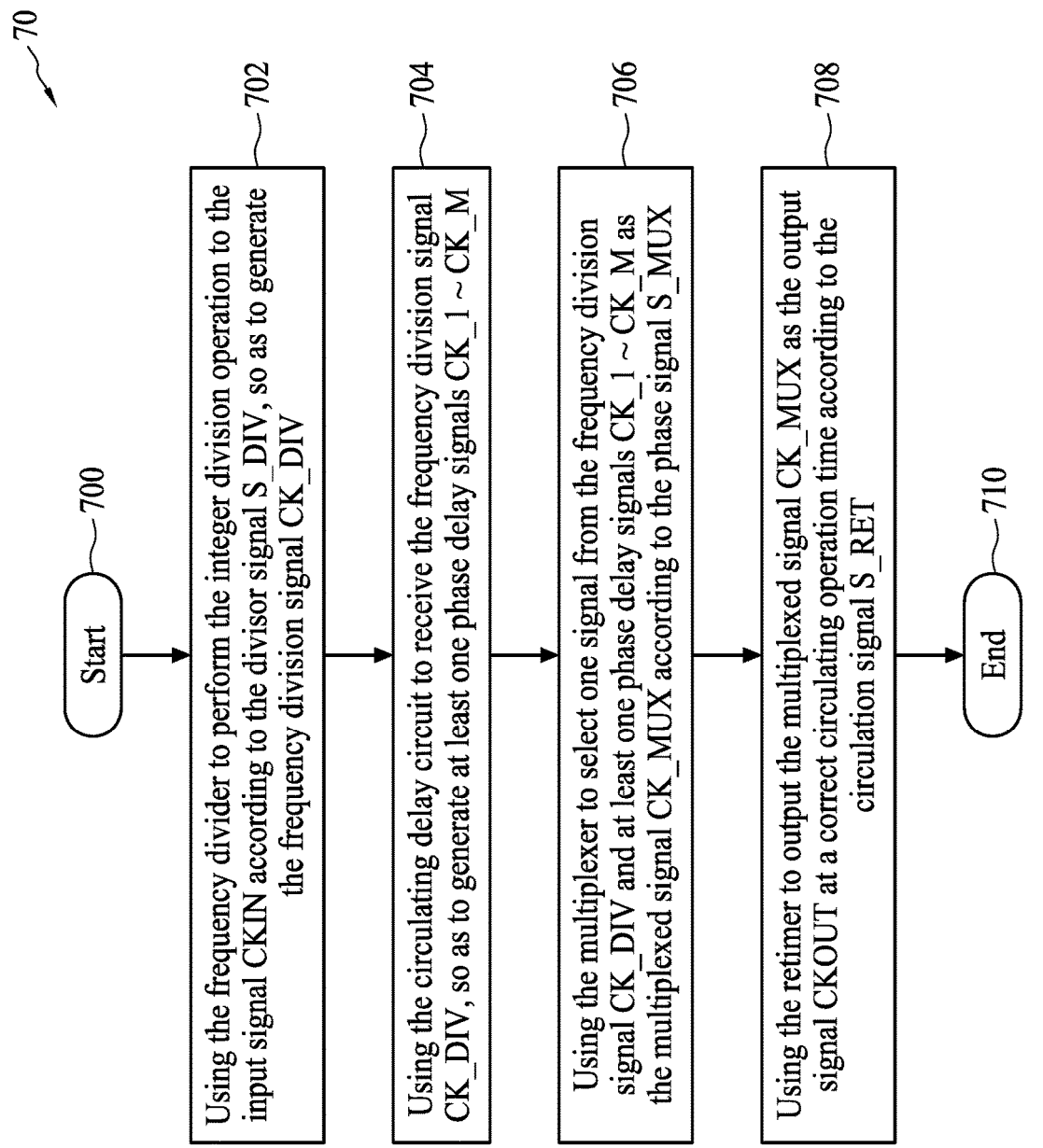
FIG. 7 is a schematic diagram illustrating the process flow according to one embodiment of the present disclosure.

The operation process described above with respect to a frequency generator performing a fractional frequency division operation to generate an output signal CKOUT according to an input signal CKIN may be summarized as a process 70, as shown in FIG. 7. The process 70 can be used in a frequency generator, wherein the frequency generator includes a frequency divider for receiving an input signal CKIN, and is configured to perform an integer frequency division operation to the input signal according to a divisor signal S_DIV, so as to generate a frequency division signal CK_DIV. A circulating delay circuit is coupled to the frequency divider and configured to continuously perform circulating operations according to the frequency division signal CK_DIV, wherein, during each circulating operation, the circulating delay circuit generates at least one phase delay signals CK_1~CK_M. A multiplexer is coupled to the circulating delay circuit and configured to select one signal from the frequency division signal CK_DIV and the phase delay signals CK_1~CK_M as a multiplexed signal CK_MUX according to a phase signal S_MUX. A retimer is coupled to the multiplexer and configured to generate an output signal CKOUT during the correct circulating operation time according to a circulation signal S_RET and the multiplexed signal CK_MUX. The process 70 includes the following steps:

Step 700: Start.

Step 702: Using the frequency divider to perform the integer frequency division operation to the input signal CKIN according to the divisor signal S_DIV, so as to generate the frequency division signal CK_DIV.

Step 704: Using the circulating delay circuit to receive the frequency division signal CK_DIV, so as to generate at least one phase delay signals CK_1~CK_M.

Step 706: Using the multiplexer to select one signal from the frequency division signal CK_DIV and at least one phase delay signals CK_1~CK_M as the multiplexed signal CK_MUX according to the phase signal S_MUX.

Step 708: Using the retimer to output the multiplexed signal CK_MUX as the output signal CKOUT at a correct circulating operation time according to the circulation signal S_RET.

Step 710: End.

Details of the process 70 are described in the foregoing paragraphs (but not limited thereto), and hence are omitted herein.

In the conventional art, in order to generate different phases for performing the fractional frequency division operation, either by disposing a great number of phase generating units to increase the output signal, or by using the sigma-delta modulator of the frequency combiner, the power consumption would be increased and the signal quality would be decreased. In contrast, by using the frequency generator according to the present disclosure, it is feasible to use the circulating delay circuit to continuously generate different phases with a smaller area occupation; and it is also feasible to use the multiplexer and the retimer to perform the selection for the phase signal and the correct circulating operation, thereby achieving an open-loop and low-power frequency generator.

What is claimed is:

1. A frequency generator, comprising:
  a control unit, configured to receive an input signal to generate a divisor signal, a phase signal and a circulation signal;
  a frequency divider, configured to receive the input signal and perform an integer division to the input signal according to the divisor signal, so as to generate a frequency division signal;
  a circulating delay circuit, coupled to the frequency divider and configured to perform at least one circulating operation to the frequency division signal, and for each circulating operation, generate at least one phase delay signal;
  a first multiplexer, coupled to the circulating delay circuit, and configured to select one signal from the frequency division signal and the at least one phase delay signal according to the phase signal, so as to generate a multiplexed signal; and
  a retimer, coupled to the first multiplexer and configured to generate an output signal according to the circulation signal, the multiplexed signal and the frequency division signal.

2. The frequency generator of claim 1, wherein the control unit determines, in advance, a integer divisor and an amount of a delay of the next frequency division signal whenever it receives the frequency division signal to generate a corresponding divisor signal, phase signal, and circulation signal to control the frequency divider, the circulating delay circuit, the first multiplexer and the retimer.

3. The frequency generator of claim 1, wherein the frequency divider divides frequency of the input signal by an integer or by the integer plus one in order to perform the integer division to the input signal that generates the frequency division signal.

4. The frequency generator of claim 1, wherein the integer is N; when the frequency generator performs a fractional frequency division operation with a divisor of Q/M, wherein Q/M=N+P/M, wherein N, P and M are positive integers, the frequency division operation performed by the frequency generator results in a output period Tout being the (N+P/M) times of an input period Tin; the frequency division operation to the input signal with a divisor of N by the frequency divider is performed; the frequency division operation for the remaining divisor of P/M is implemented by the circulating delay circuit, the first multiplexer and the retimer.

5. The frequency generator of claim 1, wherein the frequency divider changes the divisor to perform the integer division to the input signal.

6. The frequency generator of claim 1, wherein a phase of the multiplexed signal selected by the first multiplexer changes for each circulating operation.

7. The frequency generator of claim 1, wherein the circulating delay circuit be calibrated in advance to adjust a delay of the phase delay signals.

8. The frequency generator of claim 1, wherein a phase differences between each phase delay signal are the same.

9. The frequency generator of claim 1, wherein the circulating delay circuit operates only when the frequency division signal is high.

10. The frequency generator of claim 1, wherein the circulating delay circuit comprises:
  a NAND gate, configured to receive the frequency division signal and circulation phase signal, so as to generate first phase delay signal; and
  at least one delay unit, connected in series with each other to form a series, wherein the first delay unit of the series receives the first phase delay signal, and each delay unit delays the phase delay signal outputted from the previous delay unit to generate the at least one phase delay signal, and the last delay unit of the series outputs the circulation phase signal.

11. The frequency generator of claim 10, wherein each circulating operation comprises: inputting the frequency division signal to the series of the at least one delay unit to output the circulation phase signal from the last delay unit of the series to the NAND gate.

12. The frequency generator of claim 1, wherein the circulating delay circuit comprises:
  a NOT-AND gate, configured to perform gating; and
  one buffer, configured to be switched on and continuously perform the circulating operations, and continuously generate the phase delay signals when the frequency division signal is high and delivered to the NOT-AND gate.

13. The frequency generator of claim 12, wherein the buffer feeds the phase delay signal back to the NOT-AND gate.

14. The frequency generator of claim 1, wherein the circulating delay circuit comprises:
  a NOT-AND gate, configured to perform gating; and
  at least two buffers, configured to be serially connected to form a series;

when the frequency division signal is high and delivered to the NOT-AND gate, the serially connected series of the buffers is switched on and continuously perform the circulating operations, and continuously generate the phase delay signals.

15. The frequency generator of claim 14, wherein a last buffer of the series feeds the phase delay signal back to the NOT-AND gate.

16. The frequency generator of claim 1, wherein the retimer comprises:
at least one D-type flip-flop, connected in series with each other and configured to receive the multiplexed signal, wherein a frequency input terminal of the at least one D-type flip-flop receives the multiplexed signal, so as to generate at least one retiming signal at a signal output terminal of the at least one D-type flip-flop; and
a second multiplexer, coupled to the at least one D-type flip-flop and configured to select one signal from the at least one retiming signal according to the circulation signal, so as to generate the output signal.

17. The frequency generator of claim 16, wherein the series of the D-type flip-flops is a shift register.

18. The frequency generator of claim 16, wherein the D-type flip-flops in the series delivers the frequency division signal according to a trigger of the multiplexed signal.

19. A method for generating frequency for use in a frequency generator, wherein the frequency generator includes a frequency divider, configured to receive an input signal so as to generate a frequency division signal; a circulating delay circuit, coupled to the frequency divider and configured to generate at least one phase delay signal according to the frequency division signal; a multiplexer, coupled to the circulating delay circuit and configured to perform a signal selection; a retimer, coupled to the multiplexer and configured to generate an output signal, wherein the method for generating frequency comprises:
using the frequency divider to perform an integer division to the input signal according to the divisor signal generated by the control unit, so as to generate the frequency division signal;
using the circulating delay circuit to perform at least one circulating operation according to the frequency division signal, wherein when performing each circulating operation, generating the at least one phase delay signal;
using the multiplexer to select one signal from the frequency division signal and the at least one phase delay signal according to the phase signal generated by the control unit, so as to generate a multiplexed signal; and
using the retimer to generate the output signal according to a circulation signal generated by the control unit, the frequency division signal and the multiplexed signal.

20. A method of claim 19, wherein the frequency divider divides frequency of the input signal by an integer or by the integer plus one in order to perform the integer division to the input signal that generates the frequency division signal.

* * * * *